(12) United States Patent
Kamijima et al.

(10) Patent No.: US 7,782,441 B2
(45) Date of Patent: Aug. 24, 2010

(54) ALIGNMENT METHOD AND APPARATUS OF MASK PATTERN

(75) Inventors: Akifumi Kamijima, Tokyo (JP); Hideyuki Yatsu, Tokyo (JP); Hitoshi Hatate, Tokyo (JP)

(73) Assignee: TDK Corporation, Tokyo (JP)

( * ) Notice: Subject to any disclaimer, the term of this patent is extended or adjusted under 35 U.S.C. 154(b) by 254 days.

(21) Appl. No.: 12/025,285

(22) Filed: Feb. 4, 2008

(65) Prior Publication Data
US 2009/0284719 A1  Nov. 19, 2009

(51) Int. Cl.
*G03B 27/68* (2006.01)
*G03B 27/42* (2006.01)

(52) U.S. Cl. .......................... 355/52; 355/53
(58) Field of Classification Search ............ 355/52, 355/53, 55, 77; 250/548; 356/399–401
See application file for complete search history.

(56) References Cited

U.S. PATENT DOCUMENTS

| | | | | |
|---|---|---|---|---|
| 4,699,515 A * | 10/1987 | Tanimoto et al. | ............ | 356/401 |
| 4,780,617 A | 10/1988 | Umatate et al. | | |
| 5,005,046 A * | 4/1991 | Hashimoto | ................ | 355/77 |
| 5,966,201 A * | 10/1999 | Shiraishi et al. | ............... | 355/53 |
| 6,092,031 A | 7/2000 | Yasuda | | |
| 6,416,912 B1 * | 7/2002 | Kobayashi et al. | ............ | 430/22 |
| 6,937,337 B2 * | 8/2005 | Ausschnitt et al. | .......... | 356/401 |
| 2006/0023214 A1 * | 2/2006 | Lof et al. | ................... | 356/401 |

FOREIGN PATENT DOCUMENTS

| | | |
|---|---|---|
| JP | A-2002-025899 | 1/2002 |
| JP | A-2004-228153 | 8/2004 |
| JP | A-2005-216916 | 8/2005 |
| JP | A-2006-245030 | 9/2006 |

* cited by examiner

*Primary Examiner*—Hung Henry Nguyen
(74) *Attorney, Agent, or Firm*—Oliff & Berridge, PLC

(57) ABSTRACT

An alignment method of mask patterns includes forming a first layer by transferring a first mask pattern onto a wafer, forming a second layer by transferring a second mask pattern onto the first layer, and particularly a first alignment step, forming the first layer, which performs alignment for minimizing offset between a center position of the wafer and a center position of the first mask pattern and a residual rotation error between the wafer and the first mask pattern and additional alignment for compensating an amount of possible deviation of superposition of the second layer pattern on the first layer pattern, and a second alignment step, forming the second layer, which performs only alignment for minimizing offset between a center position of the first layer pattern and a center position of the second mask pattern and a residual rotation error between the first layer pattern and the second mask pattern.

11 Claims, 5 Drawing Sheets

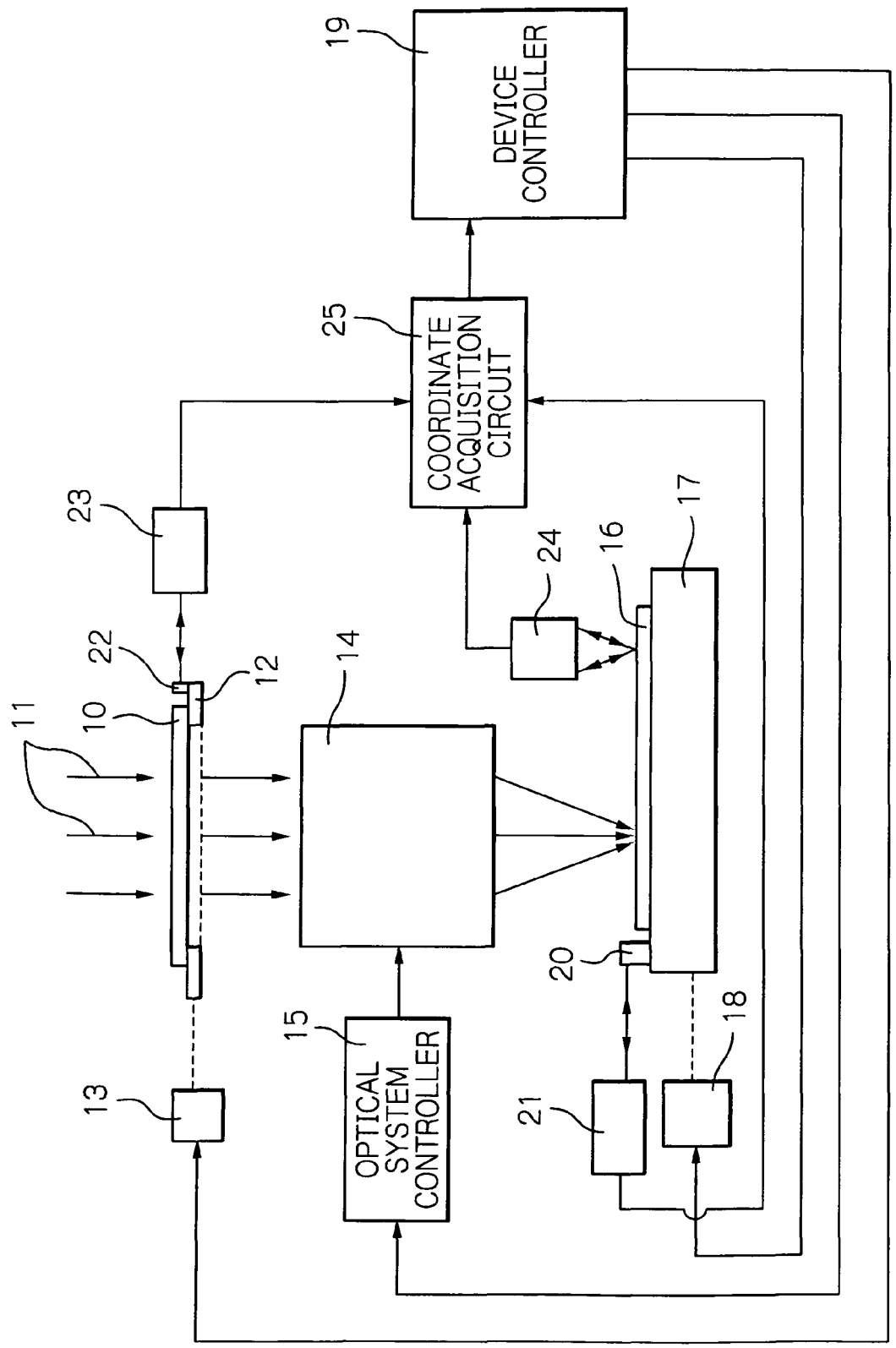

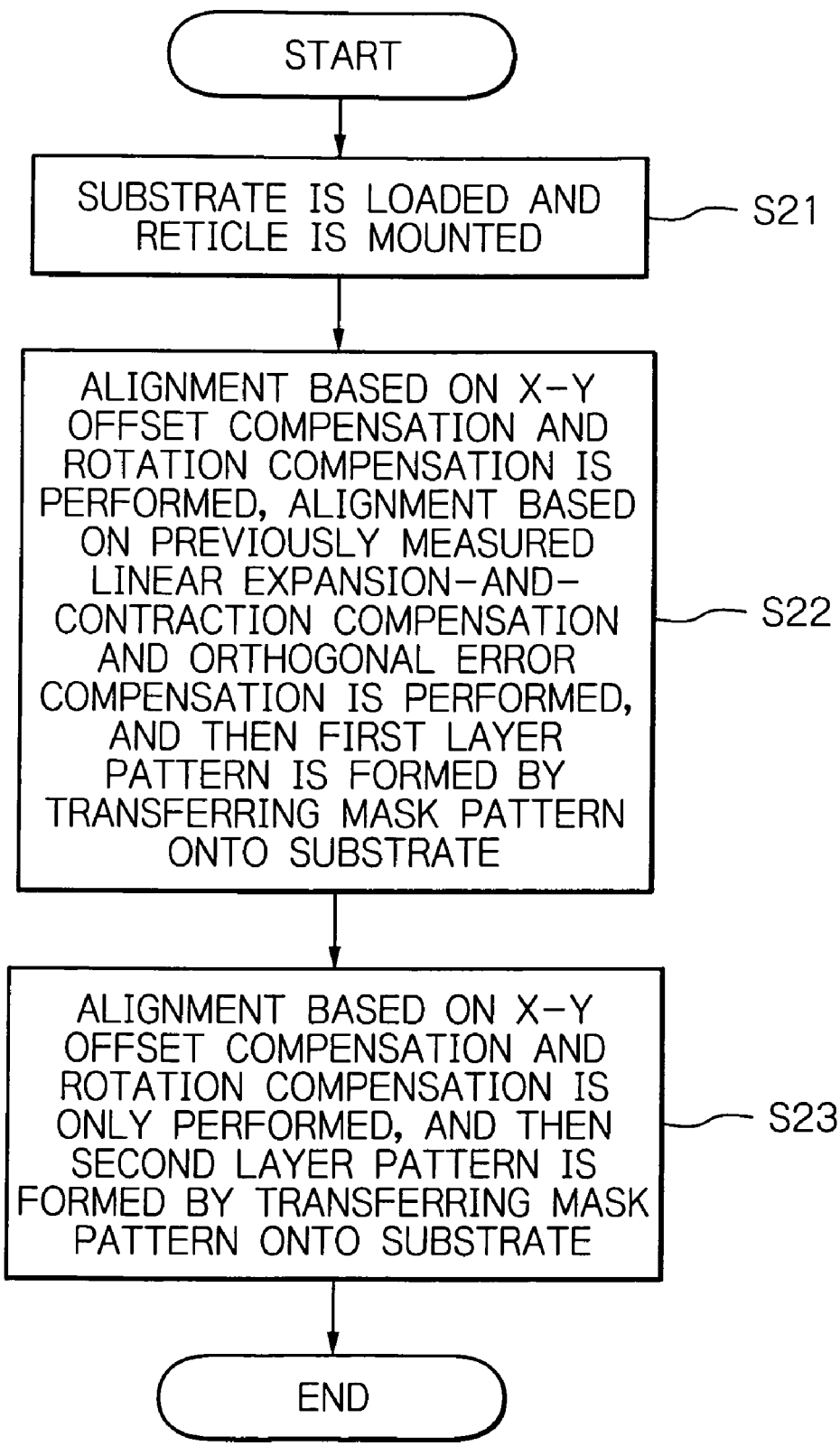

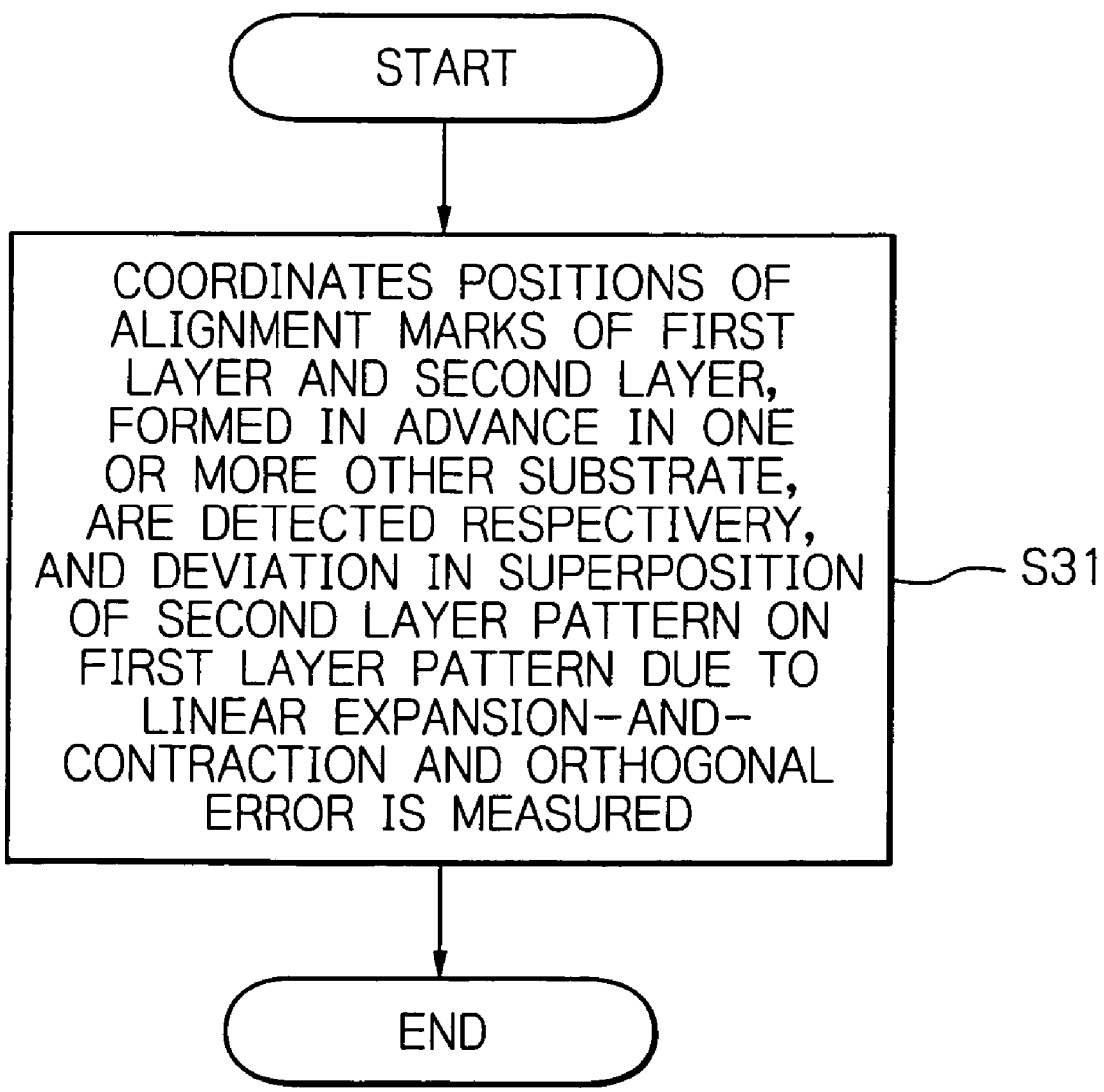

ALIGNMENT METHOD AND APPARATUS OF MASK PATTERN

BACKGROUND OF THE INVENTION

1. Field of the Invention

The present invention relates to an alignment method and apparatus of mask patterns when the mask patterns are transferred onto a wafer using an exposure apparatus.

2. Description of the Related Art

A photolithography process performed when manufacturing a thin-film device such as a thin-film magnetic head, a micro device, a semiconductor device, a liquid crystal display device and the like includes a step of transferring a mask pattern onto a wafer using an exposure apparatus such as, for example, a step of projecting and transferring a mask-pattern image onto each shot area by using a stepper. In such mask-pattern transferring step, it is required to accurately carry out alignment between a pattern on the mask called a reticle and a shot area on the wafer.

Hereinafter, described will be a conventional alignment method in case that patterns of a plurality of layers are stacked with each other, that is, for example, in case that a pattern of a first layer is formed on a wafer and a pattern of a second layer is stacked and formed on the first layer.

In such conventional method, alignment for the pattern of the second layer was performed with reference to an alignment mark of the first layer. However, a pattern arrangement state of the first layer might be in most cases deviated from a reference pattern arrangement state because of various processes might be performed after the exposure of the first layer. Therefore, in the conventional method, the coordinates of the alignment mark of the first layer were measured and the alignment for the pattern of the second layer was compensated depending upon the amount of deviation from absolute coordinates of the measured coordinates.

However, according to the conventional alignment method, because the amount of deviation of the first layer was measured and then the alignment was compensated using the measured deviation of the first layer when forming the second layer pattern, it was impossible to form the second layer pattern with high pattern arrangement precision. This is due to the fact that a state of an optical system in the exposure apparatus was deficient in stability when the second layer pattern was formed. Particularly, when the optical system of the exposure apparatus was adjusted and the amount of deviation was compensated, it took a long time until the system was stabilized, so that it was quite difficult to perform exposure in a fully stable state.

SUMMARY OF THE INVENTION

It is therefore an object of the present invention to provide an alignment method and apparatus of mask patterns whereby, when a second layer pattern is stacked over a first layer pattern, it is possible to improve accuracy in pattern-arrangement of the second layer while the alignment accuracy of the second layer relative to the first layer is maintained.

According to the present invention, an alignment method of mask patterns in patterning processes includes forming a first layer by transferring a first mask pattern onto a wafer or a layer formed on the wafer, and forming a second layer by transferring a second mask pattern onto the first layer. The method particularly includes a first alignment step of performing, when forming the first layer, alignment for minimizing offset between a center position of the wafer and a center position of the first mask pattern and a residual rotation error between the wafer and the first mask pattern, and alignment based on an amount of deviation of superposition of the second layer pattern on the first layer pattern. The deviation is caused by linear expansion and contraction of a wafer and caused by an orthogonal error between a wafer and a mask pattern, and also the deviation is obtained by measuring in advance in pattering processes successively performed for a plurality of wafers. The method also includes a second alignment step of performing, when forming the second layer, only alignment for minimizing offset between a center position of the first layer pattern and a center position of the second mask pattern and a residual rotation error between the first layer pattern and the second mask pattern.

When the first layer is formed on a wafer or on a layer formed on the wafer, alignment is performed, in addition to a usual alignment, based on an amount of deviation of superposition of the second layer pattern on the first layer pattern, caused by linear expansion and contraction of the wafer and an orthogonal error between the wafer and the mask pattern, the deviation occurring when the second layer pattern is superposed on the first layer pattern. Generally, when performing exposure of a first exposure process layer (the first layer) on the wafer, an exposure apparatus is adjusted so as to be maintained stable for a long time near an absolute coordinates as far as possible (hereinafter, this pattern-arrangement state of the first layer is referred to as a pattern arrangement state A). On the other hand, when the mask pattern of the second layer is exposed on the first layer after the first layer has been formed, various control systems are operated for compensating deviations, so that a pattern arrangement state of the second layer is deteriorated in comparison with the pattern arrangement state A (hereinafter, this state is referred to as a pattern arrangement state B). That is, when the exposure process is performed in the pattern arrangement state A, higher accuracy in the pattern arrangement can be achieved in comparison with when performed in the pattern arrangement state B.

Accordingly, as in the present invention, during the pattern arrangement state A where accuracy of a coordinate system is maintained higher, that is, when forming the first layer, the alignment is performed by compensating offsets, a residual rotation error, the linear expansion and contraction of the wafer and the orthogonal error, and the alignment is performed when forming the second layer only by minimizing an offset between the center position of the first layer pattern and the center position of a second mask pattern and a residual rotation error between the wafer and the second mask pattern, the pattern arrangement accuracy of the second layer can be brought into the same level as of the pattern arrangement state A. Thus, the pattern arrangement accuracy of the second layer can be improved with the alignment accuracy of the second layer relative to the first layer maintained.

It is preferred that in the patterning processes for forming the first layer and/or the second layer, the same exposure apparatus is used.

It is also preferred that the amount of deviation of superposition is obtained by measuring an amount of deviation of superposition of the second layer pattern on the first layer pattern. The deviation is caused by linear expansion and contraction of a wafer and caused by an orthogonal error between a wafer and a mask pattern in patterning processes of a wafer processed just before.

It is further preferred that the amount of deviation of superposition is obtained by measuring each amount of deviation of superposition of the second layer pattern on the first layer pattern. The deviation is caused by linear expansion and contraction of a wafer and caused by an orthogonal error between a wafer and a mask pattern in patterning process of each of a plurality of wafers, and by calculating a mean value of the measured deviations.

It is still further preferred that the amount of deviation of superposition is obtained by measuring an amount of deviation between a mark for measurement of superposition in the first layer pattern and a mark for measurement of superposition in the second layer pattern.

According to the present invention, also, an alignment apparatus of mask patterns in a patterning system for forming a first layer by transferring a first mask pattern onto a wafer or a layer formed on the wafer, and for forming a second layer by transferring a second mask pattern onto the first layer, includes a first alignment means for performing, when forming the first layer, alignment for minimizing offset between a center position of the wafer and a center position of the first mask pattern and a residual rotation error between the wafer and the first mask pattern, and alignment based on an amount of deviation of superposition of the second layer pattern on the first layer pattern. The deviation is caused by linear expansion and contraction of a wafer and caused by an orthogonal error between a wafer and a mask pattern, and also the deviation is obtained by measuring in advance in pattering processes successively performed for a plurality of wafers. The apparatus also includes a second alignment means for performing, when forming the second layer, only alignment for minimizing offset between a center position of the first layer pattern and a center position of the second mask pattern and a residual rotation error between the first layer pattern and the second mask pattern.

When the first layer is formed on a wafer or on a layer formed on the wafer, alignment is performed, in addition to a usual alignment, based on an amount of deviation of superposition of the second layer pattern on the first layer pattern, caused by linear expansion and contraction of the wafer and an orthogonal error between the wafer and the mask pattern, the deviation occurring when the second layer pattern is superposed on the first layer pattern. Generally, when performing exposure of a first exposure process layer (the first layer) on the wafer, an exposure apparatus is adjusted so as to be maintained stable for a long time near an absolute coordinates as far as possible (pattern arrangement state A). On the other hand, when the mask pattern of the second layer is exposed on the first layer after the first layer has been formed, various control systems are operated for compensating deviations, so that a pattern arrangement state of the second layer is deteriorated in comparison with the pattern arrangement state A (pattern arrangement state B). That is, when the exposure process is performed in the pattern arrangement state A, higher accuracy in the pattern arrangement can be achieved in comparison with when performed in the pattern arrangement state B.

Accordingly, as in the present invention, during the pattern arrangement state A where accuracy of a coordinate system is maintained higher, that is, when forming the first layer, the alignment is performed by compensating offsets, a residual rotation error, the linear expansion and contraction of the wafer and the orthogonal error, and the alignment is performed when forming the second layer only by minimizing an offset between the center position of the first layer pattern and the center position of a second mask pattern and a residual rotation error between the wafer and the second mask pattern, the pattern arrangement accuracy of the second layer can be brought into the same level as of the pattern arrangement state A. Thus, the pattern arrangement accuracy of the second layer can be improved with the alignment accuracy of the second layer relative to the first layer maintained.

It is preferred that the patterning system for forming the first layer and/or the second layer is the same exposure apparatus.

It is also preferred that the apparatus further includes a deviation measuring means for measuring in advance each amount of deviation of superposition of the second layer pattern on the first layer pattern. The deviation is caused by linear expansion and contraction of a wafer and caused by an orthogonal error between a wafer and a mask pattern in patterning processes successively performed for a plurality of wafers. Preferably, this deviation measuring means includes means for measuring an amount of deviation of superposition of the second layer pattern on the first layer pattern. The deviation is caused by linear expansion and contraction of a wafer and caused by an orthogonal error between a wafer and a mask pattern in patterning processes of a wafer processed just before. More preferably, this deviation measuring means includes means for measuring each amount of deviation of superposition of the second layer pattern on the first layer pattern. The deviation is caused by linear expansion and contraction of a wafer and caused by an orthogonal error between a wafer and a mask pattern in patterning processes of each of a plurality of wafers, and means for calculating a mean value of the measured deviations. Further preferably, this deviation measuring means includes means for measuring an amount of deviation between a mark for measurement of superposition in the first layer pattern and a mark for measurement of superposition in the second layer pattern.

Further objects and advantages of the present invention will be apparent from the following description of the preferred embodiments of the invention as illustrated in the accompanying drawings.

BRIEF DESCRIPTION OF THE DRAWINGS

FIG. 1 is a view schematically illustrating a basic configuration of a projection-type exposure apparatus as an embodiment according to the present invention;

FIG. 2 is a flowchart schematically illustrating an example of a pattern transfer process using the projection-type exposure apparatus in the embodiment of FIG. 1;

FIG. 3 is a flowchart schematically illustrating an example of the pattern transfer process using the projection-type exposure apparatus in the embodiment of FIG. 1.

DESCRIPTION OF THE PREFERRED EMBODIMENTS

Figure 4A:
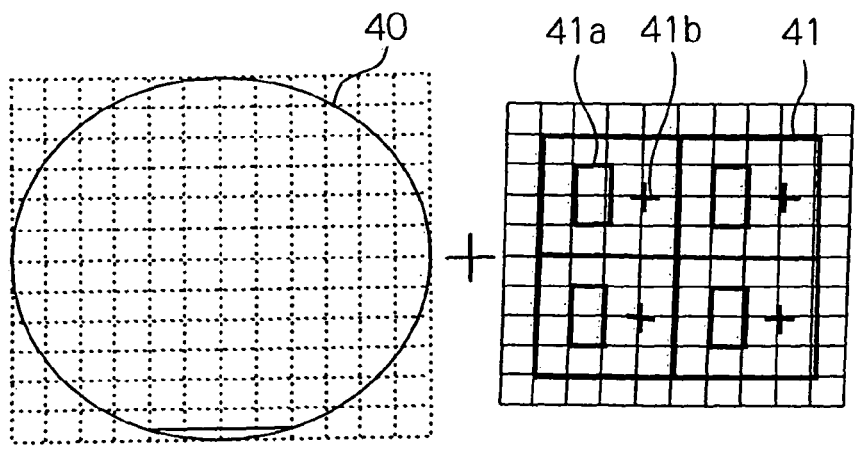
FIGS. 4a to 4g are diagrams illustrating alignment operation in the pattern transfer process of FIGS. 2 and 3.

FIG. 1 schematically illustrates a basic configuration of a projection-type exposure apparatus in an embodiment according to the present invention.

In the figure, reference numeral 10 denotes a reticle having a mask pattern, through which irradiated exposure light 11 is passed, 12 denotes a reticle-holding stage for holding the reticle 10, 13 denotes a reticle-driving device for two-dimensionally moving and slightly rotating the reticle holding stage 12 in orthogonal coordinates (X, Y) directions within a plane perpendicular to an optical axis of the exposure light 11, 14 denotes an optical projection system for converging the exposure light passed through the reticle 10 onto a surface of a wafer, 15 denotes an optical system controller for adjusting magnification, aberration and the like of the optical projection system 14, 16 denotes a wafer, 17 denotes a wafer-holding stage for holding the wafer 16 on its surface, and 18 denotes a wafer-driving device for two-dimensionally moving the wafer-holding stage 17 in orthogonal coordinates (X, Y) directions within a plane perpendicular to an optical axis of the optical projection system 14, linearly moving it in a coordinate (Z) direction parallel to the axis, and slightly rotating it.

The reticle-driving device 13, the optical system controller 15 and the wafer-driving device 18 are respectively driven according to control signals from a device controller 19.

The wafer-holding stage 17 is provided with mirrors 20 having respectively reflecting surfaces each extending in each of the orthogonal coordinates (X, Y) directions within a plane perpendicular to the optical axis of the optical projection system 14, and laser interferometers 21 opposing the respective mirrors 20 are provided in fixed positions, respectively. One laser interferometer 21 radiates two laser lights toward the mirror 20 along an X axis, and the other radiates one laser light along a Y axis, to thereby detect an X coordinate and Y coordinate (in static coordinates system) and a rotation angle of the wafer-holding stage 17.

Similarly, the reticle-holding stage 12 is provided with mirrors 22 having respectively reflecting surfaces each extending in each of the orthogonal coordinates (X, Y) directions within a plane perpendicular to the optical axis of the exposure light 11, and laser interferometers 23 opposing the respective mirrors 20 are provided in fixed positions, respectively. One laser interferometer 23 irradiates two laser lights toward the mirror 22 along an X axis, and the other radiates one laser light along a Y axis, to thereby detect an X coordinate and Y coordinate and a rotation angle of the reticle-holding stage 12.

The projection-type exposure apparatus in this embodiment is provided with a mark-coordinates detection device 24 for detecting mark coordinates of alignment marks on the wafer 16 or other marks used for alignment. This mark-coordinates detection device 24 forms and superposes an image of the alignment mark on the wafer and an index image as a reference to detect the X coordinate and the Y coordinate (in wafer coordinates system) of these marks.

The laser interferometers 21, the laser interferometers 23 and the mark-coordinates detection device 24 are connected to a coordinate acquisition circuit 25 to provide detected signals there from to the coordinate acquisition circuit 25. The coordinates acquisition circuit 25 obtains not only the X coordinate and the Y coordinate (in static coordinates system) and the rotation angle of the reticle-holding stage 12, but also the X coordinate and the Y coordinate (in static coordinates system) and the rotation angle of the wafer 16 and its alignment mark. These coordinate information obtained by the coordinate acquisition circuit 25 are applied to the device controller 19. The device controller 19 is mainly configured with a computer controlled by software, and generates, from these coordinates information, control signals to control the reticle-driving device 13, the optical system controller 15 and the wafer-driving device 18.

FIGS. 2 and 3 schematically illustrate flows in one example of a pattern transfer process using the projection-type exposure apparatus of this embodiment, and FIGS. 4a to 4g illustrate alignment operation in the pattern transfer process of FIGS. 2 and 3. Hereinafter, the pattern transfer process in this embodiment will be described with reference to these drawings.

When performing exposure process, first, a wafer or substrate 40 shown in FIG. 4a is loaded on the wafer-holding stage 17, while the reticle 10 having a first mask pattern 41 shown in FIG. 4a is mounted on the reticle-holding stage 12 (Step S21 of FIG. 2). In this example shown in FIGS. 4a to 4g, the first mask pattern 41 has four shots arranged therein, and each shot includes at least an element pattern 41a and an alignment mark 41b.

Figure 4B:
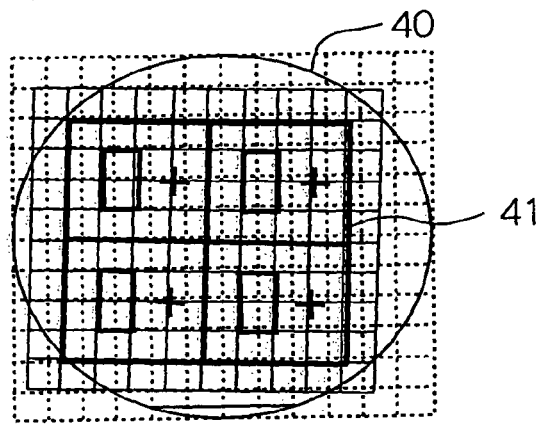
Figure 4C:
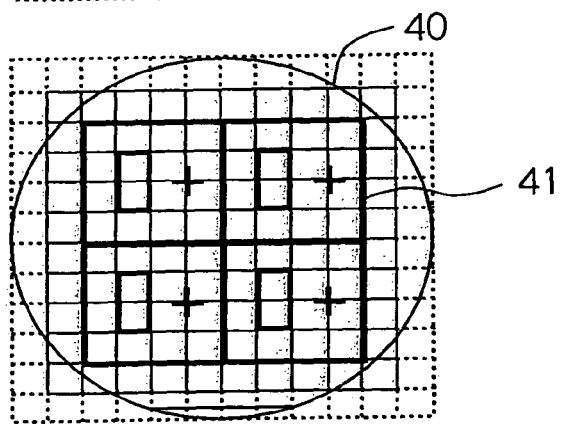
Figure 4D:
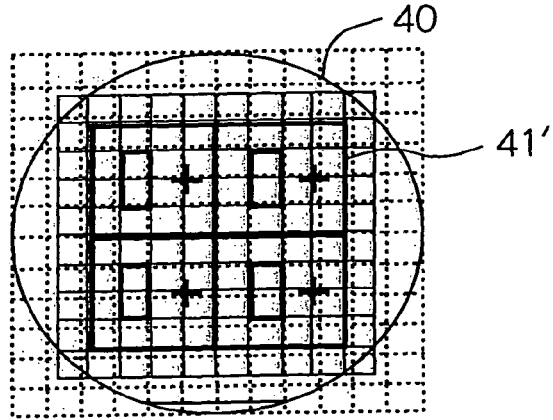

Then, by operating the exposure apparatus, as shown in FIG. 4b, the first mask pattern 41 for the first layer that is a first exposure process layer is superposed on the substrate 40 or on an under layer preliminarily formed on the substrate 40. Further, as shown in FIG. 4c, alignment of X-Y offset compensation for coinciding a center of the first mask pattern 41 with a center position of the substrate 40, and alignment of rotation compensation for minimizing the residual rotation error between the substrate 40 and the first mask pattern 41 are performed. Furthermore, by operating the exposure apparatus, alignment of linear expansion-and-contraction compensation and alignment of orthogonal error compensation are performed (Step S22 of FIG. 2). The linear expansion-and-contraction compensation is executed based on an amount of deviation in superposition of the second layer pattern on the first layer pattern, which is caused by the linear expansion and contraction of a substrate and has been measured in advance between the first layer and the second layer of another substrate. The orthogonal error compensation is executed based on an amount of deviation in superposition of the second layer pattern on the first layer pattern, which is caused by an orthogonal error. FIG. 4d shows this alignment in case that only the expansion and contraction of the substrate occurs.

The amount of deviation caused by the linear expansion and contraction of a substrate, in superposition of the second layer pattern on the first layer pattern will be obtained from the previously measured results in patterning processes of on one or more other substrates, which patterning process was performed by using the same exposure apparatus as for forming the first and/or second layer pattern. Concretely, for each of the one or more other substrates, when developing, washing and drying processes are completed after the exposure process of the second layer pattern to make a photoresist pattern of the second layer, the mark-coordinates detection device 24 detects coordinates positions of the alignment mark of the first layer or a mark for measurement of superposition, and the alignment mark of the second layer or a mark for measurement of superposition, respectively to obtain the amount of deviation caused by the linear expansion and contraction and the orthogonal error, in superposition of the second layer pattern on the first layer pattern (Step S31 of FIG. 3). The reason for preferably detecting the coordinates when the photoresist pattern has been formed is due to the fact that rework of the second layer is allowed if the coordinates are detected at this timing. However, it is apparent that the coordinates may be detected at any time other than this timing.

Detail processes in methods for detecting the X-Y offsets, the residual rotation error, the linear expansion and contraction and the orthogonal error are publicly known as in, for example, U.S. Pat. No. 4,780,617. Thus, detail description thereof is omitted.

Figure 4E:
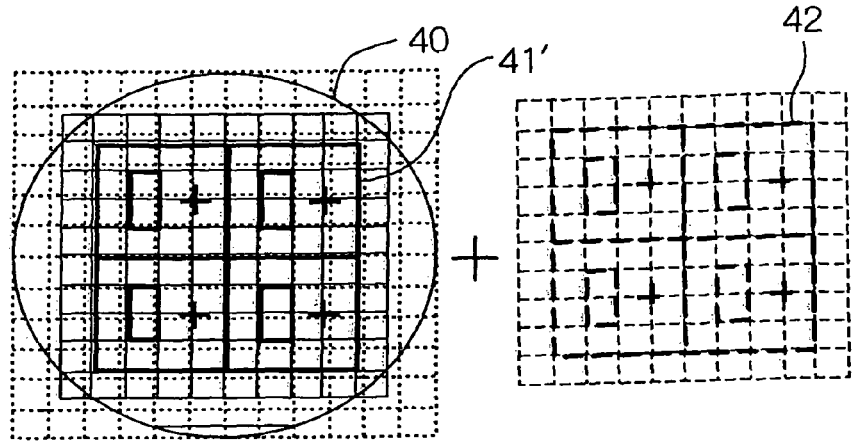
Figure 4F:
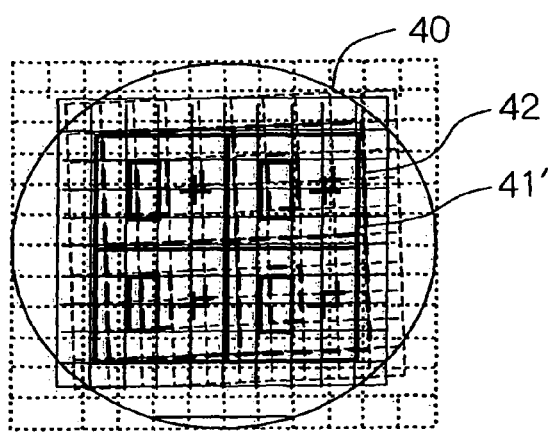
Figure 4G:
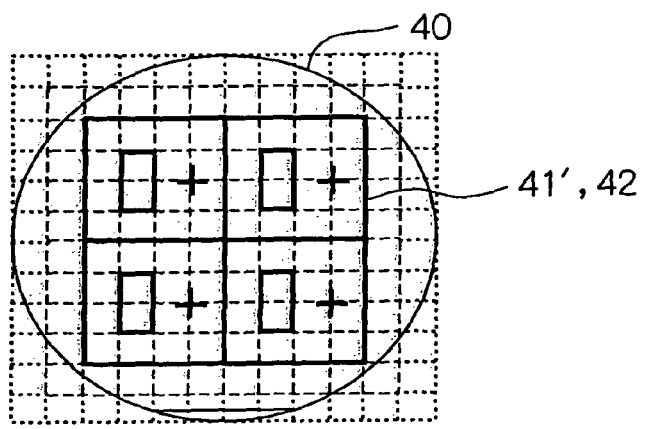

Thereafter, by operating the exposure apparatus, as shown in FIG. 4e, a second mask pattern 42 for the second layer that is a next exposure process layer is superposed on the first layer pattern. Further, as shown in FIG. 4f, only alignment of X-Y offset compensation for coinciding a center of the second mask pattern 42 with a center position of the first layer pattern and alignment of rotation compensation for minimizing the residual rotation error between the first layer pattern and the second mask pattern 42 are performed (Step S23 of FIG. 2). With this procedure, as shown in FIG. 4g, the pattern arrangement accuracy of the second layer can be brought into the same level as of the pattern arrangement state A, thus the pattern arrangement accuracy of the second layer can be improved while the alignment accuracy of the second layer relative to the first layer is maintained.

According to this embodiment, therefore, when the first layer that is a first exposure-process layer is formed on the substrate 40, in addition to usual alignments of the X-Y compensation and the rotation compensation, alignments based on the linear expansion and contraction of the substrate 40 and the orthogonal error are performed. Generally, when performing exposure of a first exposure-process layer, an exposure apparatus is adjusted so as to be maintained stable for a long time near an absolute coordinates as far as possible (the pattern arrangement state A). On the other hand, when the mask pattern of the second layer is exposed on the first layer after the first layer has been formed, various control systems are operated for compensating deviations, so that the pattern arrangement state is deteriorated in comparison with the pattern arrangement state A to be the pattern arrangement state B. In this embodiment, since during the pattern arrangement state A where accuracy of a coordinate system is maintained higher, that is, during the state of forming the first layer, compensations of the X-Y offsets, the rotation errors, the linear expansion and contraction and the orthogonal error are all performed, it is possible to improve the pattern arrangement accuracy up to that of the pattern arrangement state A while the alignment accuracy of the second layer relative to the first layer is maintained.

Many widely different embodiments of the present invention may be constructed without departing from the spirit and scope of the present invention. It should be understood that the present invention is not limited to the specific embodiments described in the specification, except as defined in the appended claims.

The invention claimed is:

1. An alignment method of mask patterns in patterning processes, including forming a first layer by transferring a first mask pattern onto a wafer or a layer formed on the wafer, and forming a second layer by transferring a second mask pattern onto said first layer, said method comprising:

a first alignment step of performing, when forming said first layer, alignment for minimizing offset between a center position of said wafer and a center position of said first mask pattern and a residual rotation error between said wafer and said first mask pattern, and additional alignment for compensating an amount of possible deviation of superposition of said second layer pattern on said first layer pattern, said possible deviation being caused by linear expansion and contraction of a wafer and caused by an orthogonal error between a wafer and a mask pattern, said deviation being obtained by measuring in advance in patterning processes successively performed for a plurality of wafers; and a second alignment step of performing, when forming said second layer, only alignment for minimizing offset between a center position of said first layer pattern and a center position of said second mask pattern and a residual rotation error between said first layer pattern and said second mask pattern.

2. The alignment method as claimed in claim 1, wherein in said patterning processes for forming said first layer and/or said second layer, the same exposure apparatus is used.

3. The alignment method as claimed in claim 1, wherein the amount of deviation of superposition is obtained by measuring an amount of deviation of superposition of the second layer pattern on the first layer pattern, said deviation being caused by linear expansion and contraction of a wafer and caused by an orthogonal error between a wafer and a mask pattern in patterning processes of a wafer processed just before.

4. The alignment method as claimed in claim 1, wherein the amount of deviation of superposition is obtained by measuring each amount of deviation of superposition of the second layer pattern on the first layer pattern, said deviation being caused by linear expansion and contraction of a wafer and caused by an orthogonal error between a wafer and a mask pattern in patterning process of each of a plurality of wafers, and by calculating a mean value of the measured deviations.

5. The alignment method as claimed in claim 1, wherein the amount of deviation of superposition is obtained by measuring an amount of deviation between a mark for measurement of superposition in the first layer pattern and a mark for measurement of superposition in the second layer pattern.

6. An alignment apparatus of mask patterns in a patterning system for forming a first layer by transferring a first mask pattern onto a wafer or a layer formed on the wafer, and for forming a second layer by transferring a second mask pattern onto said first layer, said apparatus comprising:

a first alignment means for performing, when forming said first layer, alignment for minimizing offset between a center position of said wafer and a center position of said first mask pattern and a residual rotation error between said wafer and said first mask pattern, and additional alignment for compensating an amount of possible deviation of superposition of said second layer pattern on said first layer pattern, said possible deviation being caused by linear expansion and contraction of a wafer and caused by an orthogonal error between a wafer and a mask pattern, said deviation being obtained by measuring in advance in patterning processes successively performed for a plurality of wafers; and a second alignment means for performing, when forming said second layer, only alignment for minimizing offset between a center position of said first layer pattern and a center position of said second mask pattern and a residual rotation error between said first layer pattern and said second mask pattern.

7. The alignment apparatus as claimed in claim 6, wherein said patterning system for forming said first layer and/or said second layer is the same exposure apparatus.

8. The alignment apparatus as claimed in claim 6, wherein said apparatus further comprises a deviation measuring means for measuring in advance each amount of deviation of superposition of the second layer pattern on the first layer pattern, said deviation being caused by linear expansion and contraction of a wafer and caused by an orthogonal error between a wafer and a mask pattern in patterning processes successively performed for a plurality of wafers.

9. The alignment apparatus as claimed in claim 8, wherein said deviation measuring means comprises means for measuring an amount of deviation of superposition of the second layer pattern on the first layer pattern, said deviation being caused by linear expansion and contraction of a wafer and caused by an orthogonal error between a wafer and a mask pattern in patterning processes of a wafer processed just before.

10. The alignment apparatus as claimed in claim 8, wherein said deviation measuring means comprises means for measuring each amount of deviation of superposition of the second layer pattern on the first layer pattern, said deviation being caused by linear expansion and contraction of a wafer and caused by an orthogonal error between a wafer and a mask pattern in patterning processes of each of a plurality of wafers, and means for calculating a mean value of the measured deviations.

11. The alignment apparatus as claimed in claims 8, wherein said deviation measuring means comprises means for measuring an amount of deviation between a mark for measurement of superposition in the first layer pattern and a mark for measurement of superposition in the second layer pattern.

* * * * *